United States Patent
Shimono et al.

(10) Patent No.: US 10,301,471 B2
(45) Date of Patent: May 28, 2019

(54) CURABLE RESIN COMPOSITION, CURED PRODUCT THEREOF, SEMICONDUCTOR ENCAPSULATING MATERIAL, SEMICONDUCTOR DEVICE, PREPREG, CIRCUIT BOARD, BUILD-UP FILM, BUILD-UP SUBSTRATE, FIBER-REINFORCED COMPOSITE MATERIAL, AND FIBER-REINFORCED RESIN MOLDED PRODUCT

(71) Applicant: DIC Corporation, Tokyo (JP)

(72) Inventors: Tomohiro Shimono, Ichihara (JP); Kazuo Arita, Ichihara (JP)

(73) Assignee: DIC Corporation, Tokyo (JP)

( * ) Notice: Subject to any disclaimer, the term of this patent is extended or adjusted under 35 U.S.C. 154(b) by 234 days.

(21) Appl. No.: 15/315,840

(22) PCT Filed: Feb. 19, 2015

(86) PCT No.: PCT/JP2015/054593
§ 371 (c)(1),
(2) Date: Dec. 2, 2016

(87) PCT Pub. No.: WO2015/190131
PCT Pub. Date: Dec. 17, 2015

(65) Prior Publication Data
US 2017/0101532 A1    Apr. 13, 2017

(30) Foreign Application Priority Data

Jun. 13, 2014  (JP) .................. 2014-122402

(51) Int. Cl.
| | |
|---|---|
| *B32B 27/38* | (2006.01) |
| *B32B 27/28* | (2006.01) |
| *C08J 5/24* | (2006.01) |
| *C08L 63/00* | (2006.01) |
| *C08L 79/04* | (2006.01) |
| *C08G 59/40* | (2006.01) |
| *C08L 61/34* | (2006.01) |
| *H05K 1/03* | (2006.01) |
| *C08G 73/06* | (2006.01) |

(52) U.S. Cl.
CPC ............. *C08L 79/04* (2013.01); *C08G 59/40* (2013.01); *C08G 73/06* (2013.01); *C08J 5/24* (2013.01); *C08L 61/34* (2013.01); *C08L 63/00* (2013.01); *H05K 1/03* (2013.01); *C08J 2379/04* (2013.01); *C08J 2463/00* (2013.01); *C08L 2201/02* (2013.01)

(58) Field of Classification Search
None
See application file for complete search history.

(56) References Cited

U.S. PATENT DOCUMENTS

| | | | |
|---|---|---|---|
| 6,620,905 B1* | 9/2003 | Musa ................... | C07D 265/16 525/203 |
| 2009/0187003 A1* | 7/2009 | Eguchi ................. | C07D 265/14 528/403 |
| 2011/0313080 A1* | 12/2011 | Ihara ................... | C08G 59/4014 523/400 |

FOREIGN PATENT DOCUMENTS

| | | | |
|---|---|---|---|
| EP | 2397521 A1 | 12/2011 | |
| JP | 11-012258 A | 1/1999 | |
| JP | 2003-064180 A | 3/2003 | |
| JP | 2008-291070 A | 12/2008 | |
| JP | 2010-053325 A | 3/2010 | |
| JP | 2010053324 A * | 3/2010 | ............. C08L 61/34 |
| JP | 2011-207995 A | 10/2011 | |
| JP | 2012-077243 A | 4/2012 | |

OTHER PUBLICATIONS

Machine translation of JP-2010053324-A (no date).*
Machine translation of JP-2010053325-A (no date).*
Supplementary European Search Report dated Nov. 7, 2017, issued for the European patent application No. 15805902.2.
International Search Report dated Apr. 14, 2015, issued for PCT/JP2015/054593.

* cited by examiner

*Primary Examiner* — Michael J Feely
(74) *Attorney, Agent, or Firm* — Locke Lord LLP; James E. Armstrong, IV; Nicholas J. DiCeglie, Jr.

(57) ABSTRACT

The present invention provides a curable resin composition having excellent fluidity and giving a cured product having excellent physical properties such as heat resistance, moisture resistance/solder resistance, flame retardance, and dielectric characteristics. The curable resin composition contains a resin (A) which has a benzoxazine structure represented by structural formula (A1) below and an epoxy resin (B) at such a ratio that when the total number of moles of the benzoxazine structure of the structural formula (A1) is α, and the number of moles of epoxy groups in the epoxy resin (B) is β, a ratio [β/α] is 0.1 to 0.5.

(A1)

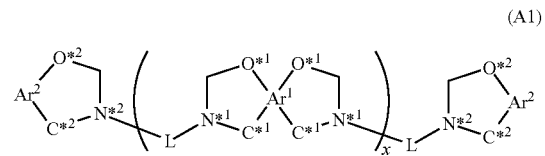

21 Claims, 1 Drawing Sheet

CURABLE RESIN COMPOSITION, CURED PRODUCT THEREOF, SEMICONDUCTOR ENCAPSULATING MATERIAL, SEMICONDUCTOR DEVICE, PREPREG, CIRCUIT BOARD, BUILD-UP FILM, BUILD-UP SUBSTRATE, FIBER-REINFORCED COMPOSITE MATERIAL, AND FIBER-REINFORCED RESIN MOLDED PRODUCT

TECHNICAL FIELD

The present invention relates a curable resin composition providing a cured product having excellent physical properties such as heat resistance, flame retardance, moisture resistance/solder resistance, and dielectric characteristics, and also relates to a cured product thereof, a semiconductor encapsulating material, a semiconductor device, a prepreg, a circuit board, a build-up film, a build-up substrate, a fiber-reinforced composite material, and a fiber-reinforced resin molded product.

BACKGROUND ART

Resin materials for electronic components used for a semiconductor encapsulating material, an insulating layer for multilayer printed boards, and the like include various resins such as an epoxy resin, a cyanate ester resin, a bismaleimide-triazine resin, a benzoxazine resin, and the like. These resin materials are required to have various performances such as heat resistance, thermal decomposition resistance, flame retardance, moisture resistance/solder resistance, dielectric characteristics, etc.

Among the various resin materials, the benzoxazine resin is excellent in characteristics such as heat resistance and dielectric characteristic of a cured product. Specifically, there are known a benzoxazine resin produced by reacting bisphenol with formalin and aniline (refer to Patent Literature 1), a polymer compound having a benzoxazine ring in a main chain (refer to Patent Literature 2 and Patent Literature 3), and the like. However, the benzoxazine resin described in Patent Literature 1 is insufficient in heat resistance, flame retardance, moisture resistance/solder resistance, and dielectric characteristics, and a benzoxazine resin containing, as a base, the polymer compound described in Patent Literatures 2 and 3 has poor fluidity, poor moldability as a semiconductor encapsulating material, and poor impregnation in a glass cloth for producing a prepreg, and a curable composition of the resin has the problem of poor handling property and insufficient heat resistance in application to the electronic materials described above. Therefore, there has been demand for development of a resin composition being excellent in any one of heat resistance, fluidity, moisture resistance/solder resistance, flame retardance, and dielectric characteristics and having good performance balance.

CITATION LIST

Patent Literature

PTL 1: Japanese Unexamined Patent Application Publication No. 11-12258
PTL 2: Japanese Unexamined Patent Application Publication No. 2003-64180
PTL 3: Japanese Unexamined Patent Application Publication No. 2008-291070

SUMMARY OF INVENTION

Technical Problem

Accordingly, a problem to be solved by the present invention is to provide a curable resin composition having excellent fluidity and providing a cured product having excellent physical properties such as heat resistance, moisture resistance/solder resistance, flame retardance, and dielectric characteristics, and also provide a cured product thereof, a semiconductor encapsulating material, a semiconductor device, a prepreg, a circuit board, a build-up film, a build-up substrate, a fiber-reinforced composite material, and a fiber-reinforced resin molded product.

Solution to Problem

As a result of intensive research for solving the problem, the inventors of the present invention found that a curable resin composition produced by using a combination of a resin having a benzoxazine structure and an epoxy resin at a specific ratio of the total number of moles of the benzoxazine structure to the number of moles of epoxy groups in the epoxy resin has excellent fluidity, and a cured product produced by curing the composition is excellent in various physical properties such as heat resistance, moisture resistance/solder resistance, flame retardance, and dielectric characteristics, thereby causing high usefulness as a resin material for electronic members. This finding led to the achievement of the present invention.

That is, the present invention relates to a curable resin composition containing a resin (A), which has a benzoxazine structure represented by structural formula (A1) below, and an epoxy resin (B) at such a ratio that when the total number of moles of the benzoxazine structure represented by the structural formula (A1) is $\alpha$, and the number of moles of epoxy groups in the epoxy resin is $\beta$, a ratio $[(\beta)/(\alpha)]$ is 0.1 to 0.5.

[Chem. 1]

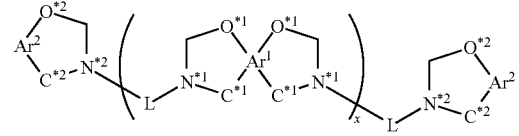

(A1)

[In the structural formula (A1),
$Ar^1$ represents a tetravalent aromatic group,
$Ar^2$ represents a divalent aromatic group,
L represents a divalent linking group,
x represents an average repeating number of 0.25 to 5.0, and
$O^{*1}$ atom and $C^{*1}$ atom represent bonds to adjacent carbon atoms of an aromatic group represented by $Ar^1$, and $O^{*2}$ atom and $C^{*2}$ atom represent bonds to adjacent carbon atoms of an aromatic group represented by $Ar^2$.]

Further, the present invention relates to a cured product produced by curing the curable resin composition.

Further, the present invention relates to a semiconductor encapsulating material containing the curable resin composition and an inorganic filler.

Further, the present invention relates to a semiconductor device produced by heat-curing the semiconductor encapsulating material.

Further, the present invention relates to a prepreg produced by impregnating a reinforcement substrate with the curable resin composition diluted with an organic solvent and semi-curing the resultant impregnated substrate.

Further, the present invention relates to a circuit board produced by diluting the curable resin composition with an organic solvent to prepare a varnish, shaping the varnish into a plate, and then molding the plate together with a copper foil under heating and pressure.

Further, the present invention relates to a build-up film produced by applying the curable resin composition diluted with an organic solvent on a base film and the drying the resin composition.

Further, the present invention relates to a build-up substrate produced by applying the build-up film on a circuit board on which a circuit has been formed, forming irregularities on the circuit board produced by heat-curing, and plating the circuit board.

Further, the present invention relates to a fiber-reinforced composite material containing the curable resin composition and reinforcement fibers.

Further, the present invention relates to the fiber-reinforced composite material described above in which the volume content of the reinforcement fibers is within a range of 40% to 85%.

Further, the present invention relates to a fiber-reinforced resin molded product produced by curing the fiber-reinforced composite material.

Further, the present invention relates to a resin having the benzoxazine structure.

Advantageous Effects of Invention

According to the present invention, it is possible to provide a curable resin composition providing a cured product having excellent heat resistance, moisture resistance/solder resistance, flame retardance, and dielectric characteristics, and also provide a cured product thereof, a semiconductor encapsulating material, a semiconductor device, a prepreg, a circuit board, a build-up film, a build-up substrate, a fiber-reinforced composite material, and a fiber-reinforced resin molded product.

DESCRIPTION OF EMBODIMENTS

<Curable Resin Composition>

Figure 1:
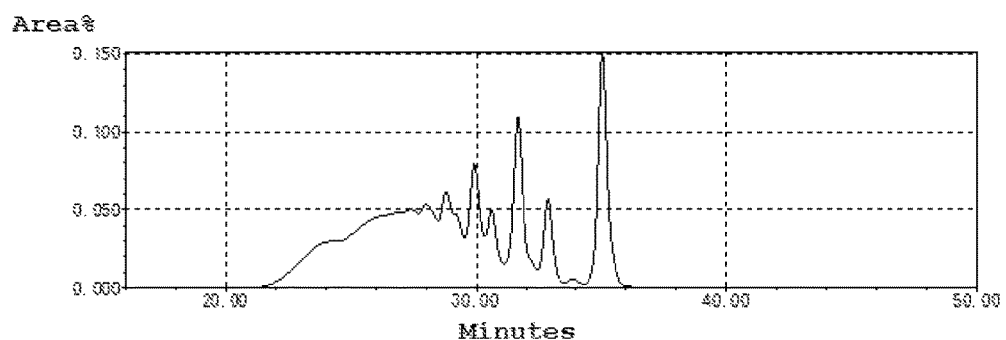
FIG. 1 is a GPC chart of a resin (A-1) having a benzoxazine structure produced in Example 1.

The present invention is described in detail below.

A curable resin composition of the present invention is a composition containing a resin (A), which has a benzoxazine structure, and an epoxy resin (B) at such a ratio that when the total number of moles of the benzoxazine structure represented by structural formula (A1) is $\alpha$, and the number of moles of epoxy groups in the epoxy resin (B) is $\beta$, a ratio $[(\beta)/(\alpha)]$ is 0.1 to 0.5.

<Resin Having Benzoxazine Structure>

The resin (A) having a benzoxazine structure is represented by structural formula (A1) below.

[Chem. 2]

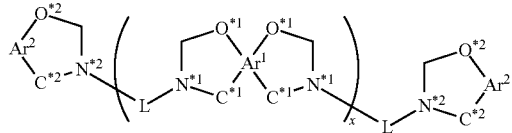

(A1)

In the structural formula (A1), $Ar^1$ represents a tetravalent aromatic group, $Ar^2$ represents a divalent aromatic group, and L represents a divalent linking group. x represents an average repeating number and the average value is 0.25 to 5.0. $O^{*1}$ atom and $C^{*1}$ atom represent bonds to adjacent carbon atoms of an aromatic group represented by $Ar^1$, and $O^{*2}$ atom and $C^{*2}$ atom represent bonds to adjacent carbon atoms of an aromatic group represented by $Ar^2$.

A structure possessed by the resin (A1) having a benzoxazine structure and containing one each of a nitrogen atom and an oxygen atom in a six-member ring is a so-called dihydrooxazine structure, and as described above, a resin such a dihydrooxazine structure is excellent in characteristics such as heat resistance and dielectric characteristics, but is insufficient in thermal decomposition resistance, flame retardance, and moisture resistance/solder resistance. In the invention of this application, it was found that the curable resin composition contains the resin (A1), which has a benzoxazine structure, and the epoxy resin (B) at such a ratio that when the total number of moles of the benzoxazine structure represented by the structural formula (A1) is $\alpha$, and the number of moles of epoxy groups in the epoxy resin is $\beta$, a ratio $[(\beta)/(\alpha)]$ is 0.1 to 0.5, the resin composition has excellent fluidity, and a cured product thereof has excellent heat resistance, low dielectric constant, low dielectric loss tangent, and excellent flame retardance and moisture resistance/solder resistance.

1. Linking Group L

As descried above, L represents a divalent linking group. Examples of the divalent linking group represented by L include a divalent hydrocarbon group and a divalent group in which one or more hydrogen atoms contained in a divalent hydrocarbon group are substituted by hydroxyl groups, alkoxy groups, or halogen atoms, and the like. The term "divalent hydrocarbon group" represents a hydrocarbon in which two hydrogens are removed from a hydrocarbon group and which is represented by "—R— (R is hydrocarbon)". Also, the term "hydrocarbon" represents an aliphatic saturated hydrocarbon, an aliphatic unsaturated hydrocarbon, an aromatic hydrocarbon, or a combination thereof.

When L represents a divalent hydrocarbon group, examples of L include an alkylene group, an alkenylene group, an alkynylene group, a cycloalkylene group, an arylene group, an aralkylene group (a divalent group having an alkylene group and an arylene group and represented by, for example, "—R—Ar—R—" (R is an aliphatic hydrocarbon group, and Ar is an aromatic hydrocarbon group)", and the like.

In this case, examples of an alkylene group include a methylene group, an ethylene group, a propylene group, a butylene group, a pentylene group, a hexylene group, and the like. Examples of an alkenylene group include a vinylene group, a 1-methylvinylene group, a propenylene group, a butenylene group, a pentenylene group, and the like. Examples of an alkynylene group include an ethynylene group, a propynylene group, a butynylene group, a pentynylene group, a hexynylene group, and the like. Examples of a cycloalkylene group include a cyclopropylene group, a cyclobutylene group, a cyclopentylene group, a cyclohexylene group, and the like. Examples of an arylene group include a phenylene group, a tolylene group, a xylylene group, a naphthylene group, and the like. Examples of an aralkylene group include an aralkylene group represented by "—R—Ar—R—" (R is an aliphatic hydrocarbon group, and Ar is an aromatic hydrocarbon group)" and having the alkylene group and the arylene group and 7 to 20 carbon atoms, and the like.

When L represents a divalent group in which one or more hydrogen atoms contained in a hydrocarbon group are substituted by hydroxyl groups, alkoxy groups, or halogen atoms, examples of L include a hydroxyl group-containing alkylene group, an alkoxy group-containing alkylene group, a halogenated alkylene group, a hydroxyl group-containing alkenylene group, an alkoxy group-containing alkenylene group, a halogenated alkenylene group, a hydroxyl group-containing alkynylene group, an alkoxy group-containing alkynylene group, a halogenated alkynylene group, a hydroxyl group-containing cycloalkylene group, an alkoxy group-containing cycloalkylene group, a halogenated cycloalkylene group, a hydroxyl group-containing arylene group, an alkoxy group-containing arylene group, a halogenated arylene group, a hydroxyl group-containing aralkylene group, an alkoxy group-containing aralkylene group, and a halogenated aralkylene group.

Examples of a hydroxyl group-containing alkylene group include a hydroxyethylene group, a hydroxypropylene group, and the like. Examples of an alkoxy group-containing alkylene group include a methoxyethylene group, a methoxypropylene group, an allyloxymethylene group, an allyloxypropylene group, a propargyloxymethylene group, a propargyloxypropylene group, and the like. Examples of a halogenated alkylene group include a chloromethylene group, a chloroethylene group, a chloropropylene group, a bromomethylene group, a bromoethylene group, a bromopropylene group, a fluoromethylene group, a fluoroethylene group, a fluoropropylene group, and the like.

Examples of a hydroxyl group-containing alkenylene group include a hydroxybutenylene group, a hydroxypentenylene group, and the like. Examples of an alkoxy group-containing alkenylene group include a methoxybutenylene group, an ethoxyhexenylene group, and the like. Examples of a halogenated alkenylene group include a chloropropenylene group, a bromopentenylene group, and the like.

Examples of a hydroxyl group-containing alkynylene group include a hydroxypentynylene group, a hydroxyhexynylene group, and the like. Examples of an alkoxy group-containing alkynylene group include an ethoxyhexynylene group, a methoxyheptynylene group, and the like. Examples of a halogenated alkynylene group include a chlorohexynylene group, a fluorooctynylene group, and the like.

Examples of a hydroxyl group-containing cycloalkylene group include a hydroxycyclohexanylene group and the like. Examples of an alkoxy group-containing cycloalkylene group include a methoxycyclopentanylene group and the like. Examples of a halogenated cycloalkylene group include a dichlorocyclopentanylene group and the like.

Examples of a hydroxyl group-containing arylene group include a hydroxyphenylene group and the like. Examples of an alkoxy group-containing arylene group include a methoxyphenylene group, an ethoxyphenylene group, an allyloxyphenylene, a propargyloxyphenylene group, and the like. Examples of a halogenated arylene group include a chlorophenyl group, a bromophenyl group, a fluorophenyl group, a chloronaphthyl group, a bromonaphthyl group, a fluoronaphthyl group, and the like.

Besides the above, L may be an unsaturated hydrocarbon group-containing arylene group. Examples of an unsaturated hydrocarbon group-containing arylene group include vinylphenylene, allylphenylene, ethynylphenylene, propargylphenylene, and the like.

In addition, L is preferably a divalent linking group represented by any one of structural formula (A2-1) below, structural formula (A2-2) below, an alkylene group, an arylene group, and an aralkylene group.

[Chem. 3]

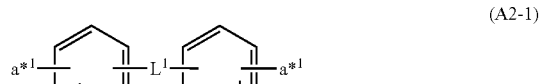

(A2-1)

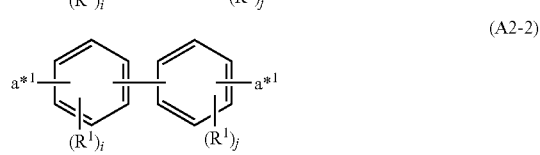

(A2-2)

In the formulae (A2-1) and (A2-2), $L^1$ represents a divalent linking group. $R^1$ each independently represent a hydrogen atom, a hydrocarbon group, an alkoxy group, a hydroxyl group, a halogen atom, or a substituent in which one or more hydrogen atoms contained in a hydrocarbon group or an alkoxy group are substituted by any of hydroxyl groups and halogen atoms. Also, i represents an integer of 1 to 4, and j represents an integer of 1 to 4. $a^{*1}$ represents a bonding point to an $N^{*1}$ atom or $N^{*2}$ in the structural formula (A1).

As described above, $L^1$ is composed of a divalent linking group. Examples of the divalent linking group represented by $L^1$ include an alkylene group, an ether group (—O— group), a carbonyl group (—CO— group), an ester group (—COO— group), an amide group (—CONH— group), an imino group (—C=N— group), an azo group (—N=N— group), a sulfide group (—S— group), a sulfone group (—SO$_3$— group), and the like.

Among the above groups, $L^1$ is preferably composed of any of an alkylene group and an ether group because a cured product has excellent flame retardance and dielectric characteristics.

Next, $R^1$ is described. As described above, $R^1$ is composed of a hydrocarbon group, an alkoxy group, a hydrogen atom, a hydroxyl group, a substituent in which one or more hydrogen atoms contained in a hydrocarbon group or an alkoxy group are substituted by any of hydroxyl groups and halogen atoms, or a halogen atom.

When the substituent $R^1$ is composed of a hydrocarbon group, examples of the substituent $R^1$ include an alkyl group, an alkenyl group, an alkynyl group, an aryl group, an aralkyl group, and the like.

Examples of the alkyl group include a methyl group, an ethyl group, a propyl group, a butyl group, a pentyl group, a hexyl group, a cyclohexyl group, and the like. Examples of the alkenyl group include a vinyl group, a 1-methylvinyl group, a propenyl group, a butenyl group, a pentenyl group, and the like. Examples of the alkynyl group include an ethynyl group, a propynyl group, a butynyl group, a pentynyl group, a hexynyl group, and the like. Examples of the aryl group include a phenyl group, a tolyl group, a xylyl group, a naphthyl group, and the like. Examples of the aralkyl group include a benzyl group, a phenylethyl group, a phenylpropyl group, a tolylmethyl group, a tolylethyl group, a tolylpropyl group, a xylylmethyl group, a xylylethyl group, a xylylpropyl group, a naphthylmethyl group, a naphthylethyl group, a naphthylpropyl group, and the like.

When the substituent $R^1$ is composed of an alkoxy group, examples of the substituent $R^1$ include a methoxy group, an ethoxy group, a propoxy group, a butoxy group, a pentanoxy group, a hexanoxy group, a cyclohexanoxy group, and the like.

When the substituent $R^1$ is composed of a substituent in which one or more hydrogen atoms contained in a hydrocarbon group are substituted by any of hydroxyl groups and halogen atoms, examples of the substituent $R^1$ include a hydroxyl group-containing alkyl group, a halogenated alkyl group, a hydroxyl group-containing alkenyl group, a halogenated alkenyl group, a hydroxyl group-containing alkynyl group, a halogenated alkynyl group, a hydroxyl group-containing aryl group, a halogenated aryl group, a hydroxyl group-containing aralkyl group, a halogenated aralkyl group, and the like.

Examples of a hydroxyl group-containing alkyl group include a hydroxyethyl group, a hydroxypropyl group, and the like. Examples of a halogenated alkyl group include a chloromethyl group, a chloroethyl group, a chloropropyl group, a bromomethyl group, a bromoethyl group, a bromopropyl group, a fluoromethyl group, a fluoroethyl group, a fluoropropyl group, and the like.

Examples of a hydroxyl group-containing alkenyl group include a 1-hydroxy-2,3-propenyl group, a 2-hydroxy-4,5-pentenyl group, and the like. Examples of a halogenated alkenyl group include a 1-chloro-3,4-butenyl group, a 2-bromo-4,5-hexenyl group, and the like.

Examples of a hydroxyl group-containing alkynyl group include a 2-hydroxy-4,5-pentynyl group, a 2-hydroxy-3,4-hexynyl group, and the like. Examples of a halogenated alkynyl group include a 1-chloro-3,4-butynyl group, a 3-bromo-5,6-hexynyl group, and the like.

Examples of a hydroxyl group-containing aryl group include a hydroxyphenyl group, a hydroxynaphthyl group, and the like. Examples of a halogenated aryl group include a chlorophenyl group, a bromophenyl group, a fluorophenyl group, a chloronaphthyl group, a bromonaphthyl group, a fluoronaphthyl group, and the like.

Examples of a hydroxyl group-containing aralkyl group include a hydroxybenzyl group, a hydroxyphenethyl group, and the like. Examples of a halogenated aralkyl group include a chlorobenzyl group, a bromophenethyl group, and the like.

When the substituent $R^1$ is composed of a substituent in which one or more hydrogen atoms contained in an alkoxy group are substituted by any of hydroxyl groups and halogen atoms, examples of the substituent $R^1$ include a hydroxyl group-containing alkoxy group, a halogenated alkoxy group, and the like.

Examples of a hydroxyl group-containing alkoxy group include a hydroxyethyloxy group and the like. Examples of a halogenated alkoxy group include a chloropropyloxy group, and the like.

When the substituent $R^1$ is composed of a halogen atom, examples of the substituent $R^1$ include a fluorine atom, a chlorine atom, a bromine atom, an iodine atom, and the like.

Besides the above, the substituent $R^1$ may be an alkoxy group-containing alkyl group, an alkoxy group-containing aryl group, or an unsaturated hydrocarbon group-containing aryl group. Examples of the alkoxy group-containing alkyl group include a methoxyethyl group, a methoxypropyl group, an allyloxymethyl group, an allyloxypropyl group, a propargyloxymethyl group, a propargyloxypropyl group, and the like. Examples of the alkoxy group-containing aryl group include a methoxyphenyl group, an ethoxyphenyl group, an allyloxyphenyl group, a propargyloxyphenyl group, and the like. Examples of the unsaturated hydrocarbon group-containing aryl group include vinylphenyl, allylphenyl, ethynylphenyl, propargylphenyl, and the like.

Among the above groups, the substituent $R^1$ is preferably a hydrogen atom, an alkyl group, or an aralkyl group, and the substituent $R^1$ is more preferably composed of a hydrogen atom because the resin having a benzoxazine structure having excellent heat resistance and moisture resistance/solder resistance can be produced.

In addition, the linking group $L^1$ which links two aromatic rings in the structural formula (A2-1) may be bonded to any of the carbon atoms constituting the aromatic rings, but the linking group $L^1$ is preferably bonded at the para-position or meta-position with respect to $a^{*1}$ in either aromatic ring because a cured product has excellent flame retardance and dielectric characteristics. The linking group $L^1$ is more preferably bonded at the para-position with respect to $a^{*1}$ in either aromatic ring.

In addition, in the structural formula (A2-2), the two aromatic rings on a biphenyl skeleton may be bonded to each other at any position, but the two aromatic rings are preferably bonded to each other at the para-position or meta-position with respect to $a^{*1}$ in either aromatic ring because a cured product has excellent flame retardance and dielectric characteristics. The two aromatic rings are more preferably bonded at the para-position with respect to $a^{*1}$ in either aromatic ring.

2. Aromatic Group $Ar^1$

Next, $Ar^1$ contained in the structural formula (1) is described. As described above, $Ar^1$ is a tetravalent aromatic group. Examples of a tetravalent aromatic group represented by $Ar^1$ include a benzene ring, a naphthalene ring, an anthracene ring, groups represented by structural formulae (A3-1) to (A3-4) below, and the like.

[Chem. 4]

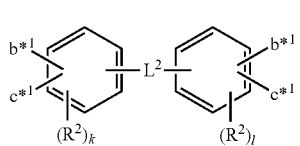

(A3-1)

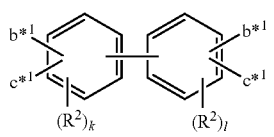

(A3-2)

-continued

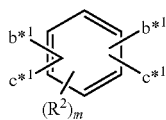
(A3-3)

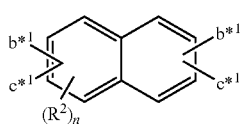
(A3-4)

In the formulae (A3-1) to (A3-4), L2 represents a divalent linking group, R2 each independently represent a hydrogen atom, a hydrocarbon group, an alkoxy group, a hydroxyl group, a halogen atom, or a substituent in which one or more hydrogen atoms contained in a hydrocarbon group or an alkoxy group are substituted by any of hydroxyl groups and halogen atoms. Also, k represents an integer of 1 to 3, l represents an integer of 1 to 3, m represents an integer of 1 to 2, and n represents an integer of 1 to 4. b*1 and c*1 represent bonding points to an $O^{*1}$ atom and $C^{*1}$ atom, respectively, shown in the structural formula (A1) and represent bonds to adjacent carbon atoms of an aromatic group shown in each of the structural formulae (A3-1) to (A3-4).

As described above, in the structural formulae (A3-1) to (A3-4), L2 represents a divalent linking group. Examples of the divalent linking group represented by L2 include the same groups as L1. Like in the case of L1, L2 is preferably an alkylene group or an ether group because a cured product has excellent flame retardance and dielectric characteristics.

As described above, $R^2$ in the formulae (A3-1) to (A3-4) each independently represent a hydrogen atom, a hydrocarbon group, an alkoxy group, a hydroxyl group, a substituent in which one or more hydrogen atoms contained in a hydrocarbon group or an alkoxy group are substituted by any of hydroxyl groups and halogen atoms, or a halogen atom.

Examples of a substituent represented by $R^2$ include the same groups as $R^1$. Like in the case of the substituent $R^1$, the substituent $R^2$ is preferably composed of a hydrogen atom, an alkyl group, or an aralkyl group, and is more preferably composed of a hydrogen atom because a resin having a benzoxazine structure with excellent heat resistance and moisture resistance/solder resistance can be produced.

In addition, the linking group $L^2$ which links two aromatic rings in the structural formula (A3-1) may be bonded to any of the carbon atoms constituting the aromatic rings, but the linking group $L^2$ is preferably bonded at the para-position or meta-position with respect to b*1 in either aromatic ring because a cured product has excellent flame retardance and dielectric characteristics. The linking group $L^2$ is more preferably bonded at the para-position with respect to b*1 in either aromatic ring.

In addition, in the structural formula (A3-2), the two aromatic rings on a biphenyl skeleton may be bonded to each other at any position, but the two aromatic rings are preferably bonded to each other at the para-position or meta-position with respect to b*1 in either aromatic ring because a cured product has excellent flame retardance and dielectric characteristics. The two aromatic rings are more preferably bonded at the para-position with respect to b*1 in either aromatic ring.

3. Aromatic Group $Ar^2$

Next, $Ar^2$ contained in the structural formula (1) is described. As described above, $Ar^2$ is a divalent aromatic group. Examples of the divalent aromatic group represented by $Ar^2$ include aromatic groups represented by structural formulae (A4-1) and (A4-2) below, an aromatic group having an anthracene ring, and the like.

[Chem. 5]

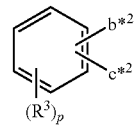
(A4-1)

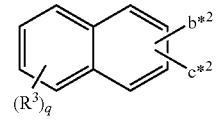
(A4-2)

In the formulae (A4-1) and (A4-2), $R^3$ each independently represent any one substituent selected from the group consisting of a hydrogen atom, a hydrocarbon group, an alkoxy group, and a hydroxyl group, a substituent in which one or more hydrogen atoms contained in a hydrocarbon group or an alkoxy group are substituted by any of hydroxyl groups and halogen atoms, or a halogen atom. Also, p represents an integer of 1 to 4 and q represents an integer of 1 to 6. b*2 and c*2 represent bonding points to an $O^{*2}$ atom and $C^{*2}$ atom, respectively, shown in the structural formula (A1) and represent bonds to adjacent carbon atoms of an aromatic group shown in each of the structural formulae (A4-1) and (A4-2).

As described above, $R^3$ each independently represent a hydrogen atom, a hydrocarbon group, an alkoxy group, a hydroxyl group, a halogen atom, or a substituent in which one or more hydrogen atoms contained in a hydrocarbon group or an alkoxy group are substituted by any of hydroxyl groups and halogen atoms.

Examples of a substituent represented by $R^3$ include the same groups as $R^1$ and $R^2$. Like in the case of the substituents $R^1$ and $R^2$, the substituent $R^3$ is preferably composed of a hydrogen atom, an allyl group, or an aralkyl group, and is more preferably composed of a hydrogen atom because a resin having a benzoxazine structure with excellent heat resistance and moisture resistance/solder resistance can be produced.

The repeating number x in the structural formula (A1) of the resin (A) having a benzoxazine structure is preferably 0.25 or more and less than 2.0 because a curable resin composition having excellent fluidity can be produced. When the repeating number x in the structural formula (A1) of the resin (A) having a benzoxazine structure is 2 or more, its structure may have the same type or different types of aromatic groups $Ar^1$. For example, when the repeating number x in the structural formula (A1) of the resin (A) having a benzoxazine structure is 4, its structure may have all or only some of the aromatic groups $Ar^1$ represented by the structural formulae (A3-1) to (A3-4).

Further, when the repeating number x in the structural formula (A1) of the resin (A) having a benzoxazine structure is 2 or more, the structure may have the same or different linking groups L. For example, when the repeating number x in the structural formula (A1) of the resin (A) having a benzoxazine structure is 4, the structure may have an alkylene group, an arylene group, or all or only some of the linking groups L represented by the structural formulae (A2-1) and (A2-2).

<Epoxy Resin>

The epoxy resin (B) used in the curable resin composition of the present invention is described. Examples of the epoxy resin (B) include a bisphenol A-type epoxy resin, a bisphenol F-type epoxy resin, a bisphenol E-type epoxy resin, a bisphenol S-type epoxy resin, a bisphenol sulfide-type epoxy resin, a phenylene ether-type epoxy resin, a naphthylene ether-type epoxy resin, a biphenyl-type epoxy resin, a tetramethylbiphenyl-type epoxy resin, a polyhydroxynaphthalene-type epoxy resin, a phenol novolac-type epoxy resin, a cresol novolac-type epoxy resin, a triphenylmethane-type epoxy resin, a tetraphenylethane-type epoxy resin, a dicyclopentadiene-phenol addition reaction-type epoxy resin, a phenol aralkyl-type epoxy resin, a naphthol novolac-type epoxy resin, a naphthol aralkyl-type epoxy resin, a naphtholphenol co-condensed novolac-type epoxy resin, a naphtholcresol co-condensed novolac-type epoxy resin, a naphthylene ether-type epoxy resin, an aromatic hydrocarbon formaldehyde resin-modified phenol resin-type epoxy resin, a biphenyl-modified novolac-type epoxy resin, an anthracene-type epoxy resin, and the like. These may be used alone or in combination of two or more.

Among these epoxy resins (B), an epoxy resin having an average number of functional groups of 2 to 4 is preferably used particularly in view of the point that a cured product having excellent heat resistance can be produced. Examples of such an epoxy resin include a tetramethylbiphenol-type epoxy resin, a biphenyl aralkyl-type epoxy resin, a naphthylene ether-type epoxy resin, a polyhydroxynaphthalene-type epoxy resin, a novolac-type epoxy resin, a naphthol novolac-type epoxy resin, a naphthol aralkyl-type epoxy resin, a naphthol-phenol co-condensed novolac-type epoxy resin, a naphthol-cresol co-condensed novolac-type epoxy resin, and a dicyclopentadiene-phenol addition reaction-type epoxy resin. Among the above resins, in view of the point that a cured product further having excellent dielectric characteristics can be produced, preferred are a naphthol novolac-type epoxy resin, a naphthol aralkyl-type epoxy resin, a naphthol-phenol co-condensed novolac-type epoxy resin, a naphthol-cresol co-condensed novolac-type epoxy resin, a naphthylene novolac-type epoxy resin, a naphthylene aralkyl-type epoxy resin, a naphthylene-phenol co-condensed novolac-type epoxy resin, a naphthylene-cresol co-condensed novolac-type epoxy resin, and a naphthylene ether-type epoxy resin.

<Curable Resin Composition>

The curable resin composition of the present invention essentially contains the resin (A) having a benzoxazine structure described above and the epoxy resin (B) at a specific functional group ratio, but a curing agent for an epoxy resin can be used in combination with these resins. When the curing agent for an epoxy resin is used simultaneously, the curing agent for an epoxy resin may be used simultaneously within a range in which the curable resin composition exhibits the effect of the present invention. Specifically, the curing agent for an epoxy resin may be used simultaneously within a range in which when the total number of moles of the benzoxazine structure represented by the structural formula (A1) is $\alpha$, and the number of moles of epoxy groups in the epoxy resin (B) reacting the benzoxazine structure is $\gamma$, a ratio $[(\gamma)/(\alpha)]$ is 0.1 to 0.5.

Usable examples of the curing agent for an epoxy resin include curing agents such as an amine-based compound, an amide-based compound, an acid anhydride-based compound, and the like. Specific examples of the amine-based compound include diaminodiphenylmethane, diaminodiphenyl ether, diethylene triamine, triethylene tetramine, diaminodiphenyl sulfone, isophorone diamine, guanidine derivatives, and the like. Specific examples of the amide-based compound include dicyandiamide, a polyamide resin synthesized by using linolenic acid dimer and ethylenediamine, and the like. Specific examples of the acid anhydride-based compound include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride, and the like.

The curable resin composition of the present invention can contain another thermosetting resin used in combination with the resin (A) having a benzoxazine structure described above and the epoxy resin (B). When the other thermosetting resin is used simultaneously, the other thermosetting resin may be used simultaneously within a range in which the curable resin composition exhibits the effect of the present invention. Specifically, the other thermosetting resin may be used simultaneously within a range in which when the total number of moles of the benzoxazine structure represented by the structural formula (A1) is $\alpha$, and the number of moles of epoxy groups in the epoxy resin (B) reacting the benzoxazine structure is $\gamma$, a ratio $[(\gamma)/(\alpha)]$ is 0.1 to 0.5.

Examples of the other thermosetting resin include a cyanate ester resin, a resin having a benzoxazine structure other than the structural formula (A1), a maleimide compound, an active ester resin, a vinylbenzyl compound, an acryl compound, a copolymer of styrene and maleic anhydride, and the like. When the other thermosetting resin is used simultaneously, the amount of use is not particularly limited as long as the effect of the present invention is not impaired, but is preferably within a range of 1 to 50 parts by mass in 100 parts by mass of the curable resin composition.

Examples of the cyanate ester resin include a bisphenol A-type cyanate ester resin, a bisphenol F-type cyanate ester resin, a bisphenol E-type cyanate ester resin, a bisphenol S-type cyanate ester resin, a bisphenol sulfide-type cyanate ester resin, a phenylene ether-type cyanate ester resin, a naphthylene ether-type cyanate ester resin, a biphenyl-type cyanate ester resin, a tetramethylbiphenyl-type cyanate ester resin, a polyhydroxynaphthalene-type cyanate ester resin, a phenol novolac-type cyanate ester resin, a cresol novolac-type cyanate ester resin, a triphenylmethane-type cyanate ester resin, a tetraphenylethane-type cyanate ester resin, a dicyclopentadiene-phenol addition reaction-type cyanate ester resin, a phenol aralkyl-type cyanate ester resin, a naphthol novolac-type cyanate ester resin, a naphthol aralkyl-type cyanate ester resin, a naphthol-phenol co-condensed novolac-type cyanate ester resin, a naphthol-cresol co-condensed novolac-type cyanate ester resin, an aromatic hydrocarbon formaldehyde resin-modified phenol resin-type cyanate ester resin, a biphenyl-modified novolac-type cyanate ester resin, an anthracene-type cyanate ester resin, and the like. These may be used alone or in combination of two or more.

Among these cyanate ester resins, in view of the point that a cured product having excellent heat resistance can be produced, preferably used are a bisphenol A-type cyanate ester resin, a bisphenol F-type cyanate ester resin, a bisphenol E-type cyanate ester resin, a polyhydroxynaphthalene-type cyanate ester resin, a naphthylene ether-type cyanate ester resin, and a novolac-type cyanate ester resin. In view of the point that a cured product having excellent dielectric characteristics can be produced, preferred is a dicyclopentadiene-phenol addition reaction-type cyanate ester resin.

The resin having a benzoxazine structure other than the structural formula (A1) is not particularly limited, and examples thereof include a reaction product (F-a type benzoxazine resin) of bisphenol F, formalin, and aniline, a reaction product (P-d type benzoxazine resin) of diaminodiphenylmethane, formalin, and phenol, a reaction product of bisphenol A, formalin, and aniline, a reaction product of dihydroxydiphenyl ether, formalin, and aniline, a reaction product of diaminodiphenyl ether, formalin, and phenol, a reaction product of dicyclopentanediene-phenol addition type resin, formalin, and aniline, a reaction product of phenolphthalein, formalin, aniline, a reaction product of diphenyl sulfide, formalin, and aniline, and the like. These may be used alone or in combination of two or more.

Examples of the maleimide compound include various compounds represented by any of structural formulae (i) to (iii) below, and the like.

[Chem. 6]

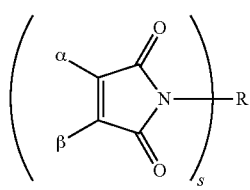

(i)

(In the formula, R is an m-valent organic group, α and β are each any of a hydrogen atom, a halogen atom, an alkyl group, and an aryl group, and s is an integer of 1 or more.)

[Chem. 7]

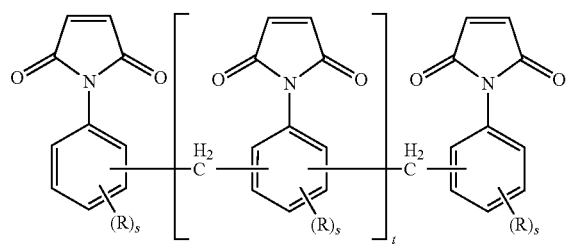

(ii)

(In the formula, R is any one of a hydrogen atom, an alkyl group, an aryl group, an aralkyl group, a halogen atom, a hydroxyl group, and an alkoxy group, s is an integer of 1 to 3, and t is an average of repeating units and is 0 to 10.)

[Chem. 8]

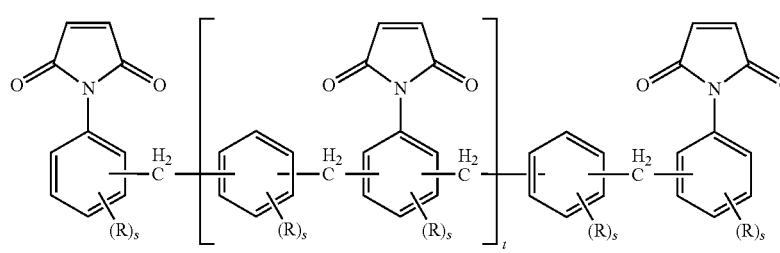

(iii)

(In the formula, R is any of a hydrogen atom, an alkyl group, an aryl group, an aralkyl group, a halogen atom, a hydroxyl group, and an alkoxy group, s is an integer of 1 to 3, and t is an average of repeating units and is 0 to 10.) These may be used alone or in combination of two or more.

The active ester resin is not particularly limited, but a compound having two or more ester groups with high reaction activity in one molecule is preferably used, and examples thereof include phenol esters, thiophenol esters, N-hydroxyamine esters, esters of heterocyclic hydroxy compounds, and the like. The active ester resin is preferably produced by condensation reaction of a carboxylic acid compound and/or thiocarboxylic acid compound with a hydroxyl compound and/or thiol compound. In particular, from the viewpoint of improving heat resistance, the active ester resin produced by a carboxylic acid compound or halide thereof and a hydroxyl compound is preferred, and the active ester resin produced by a carboxylic acid compound or halide thereof and a phenol compound and/or naphthol compound is more preferred. Examples of the carboxylic acid compound include benzoic acid, acetic acid, succinic acid, maleic acid, itaconic acid, phthalic acid, isophthalic acid, terephthalic acid, pyromellitic acid, and the like, and halides thereof. Examples of the phenol compound or naphthol compound include hydroquinone, resorcin, bisphenol A, bisphenol F, bisphenol S, dihydroxydiphenyl ether, phenolphthalein, methylated bisphenol A, methylated bisphenol F, methylated bisphenol S, phenol. o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucinol, benzenetriol, dicyclopentadiene-phenol addition-type resin, and the like.

Preferred examples of the active ester resin include an active ester resin containing a dicyclopentadiene-phenol addition structure, an active ester resin containing a naphthalene structure, an active ester resin produced by acetylation of phenol novolac, an active ester resin produced by benzoylation of phenol novolac, and the like. Among these, the active ester resin containing a dicyclopentadiene-phenol addition structure and the active ester resin containing a naphthalene structure are more preferred in view of excellent improvement of peel strength. More specific examples of the active ester resin containing a dicyclopentadiene-phenol addition structure include compounds represented by general formula (iv) below.

[Chem. 9]

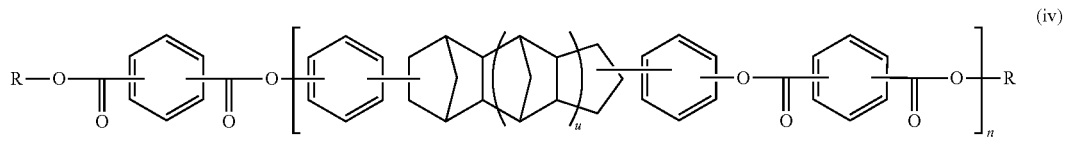

In the formula (iv), R represents a phenyl group or a naphthyl group, u represents 0 or 1, and n represents an average of repeating units of 0.05 to 2.5. From the viewpoint of decreasing the dielectric loss tangent and improving heat resistance of a cured product of the resin composition, R is preferably a naphthyl group, u is preferably 0, and n is preferably 0.25 to 1.5.

Curing of the curable resin composition of the present invention proceeds without a catalyst, but a catalyst (C) can be used simultaneously. Examples of the catalyst (C) include tertiary amine compounds such as imidazole, dimethylaminopyridine, and the like; phosphorus-based compounds such as triphenylphosphine and the like; boron trifluoride; boron trifluoride-amine complexes such as a boron trifluoride-monoethylamine complex and the like; organic acid compounds such as thiodipropionic acid and the like; benzoxazine compounds such as thiodiphenol benzoxazine, sulfonyl benzoxazine and the like; sulfonyl compounds; phenolic hydroxyl group-containing compounds; and the like. Examples of the phenolic hydroxyl group-containing compounds include phenol, cresol, dihydroxybenzene, bisphenol A, bisphenol F, bisphenol E, bisphenol S, bisphenol sulfide, dihydroxyphenylene ether, a phenol novolac resin, a cresol novolac resin, an aromatic hydrocarbon formaldehyde resin-modified phenol resin, a naphthylene ether resin, a dicyclopentadiene phenol addition-type resin, a phenol aralkyl resin, a naphthol aralkyl resin, a trimethylolmethane resin, a tetraphenylolethane resin, a naphthol novolac resin, a naphthol-phenol co-condensed novolac resin, a naphthol-cresol co-condensed novolac resin, a biphenyl-modified phenol resin (polyhydric phenol compound in which phenol nuclei are connected through a bismethylene group), a biphenyl-modified naphthol resin (polyhydric naphthol compound in which phenol nuclei are connected through a bismethylene group), an aminotriazine-modified phenol resin (polyhydric phenol compound in which phenol nuclei are connected through melamine and benzoguanamine), and the like. These may be used alone or in combination of two or more. The amount of the catalyst (C) added is preferably within a range of 0.001 to 15 parts by mass in 100 parts by mass of the curable resin composition.

Also, in use for application in which the curable resin composition of the present invention is required to have high flame retardance, a non-halogen flame retardant substantially not containing a halogen atom may be mixed.

Examples of the non-halogen flame retardant include a phosphorus-based flame retardant, a nitrogen-based flame retardant, a silicone-based flame retardant, an inorganic flame retardant, an organic metal salt-based flame retardant, and the like. The use of these is not limited, and these may be used alone or in combination of the same type of a plurality of flame retardants or different types of flame retardants.

Either an inorganic or organic type can be used as the phosphorus-based flame retardant. Examples of an inorganic compound include red phosphorus, ammonium phosphates such as monoammonium phosphate, diammonium phosphate, triammonium phosphate, polyammonium phosphate, and the like; inorganic nitrogen-containing phosphorus compounds such as phosphoric acid amide and the like.

Also, the red phosphorus is preferably surface-treated for the purpose of preventing hydrolysis or the like, and examples of a surface treatment method include (i) a method of coating with an inorganic compound such as magnesium hydroxide, aluminum hydroxide, zinc hydroxide, titanium hydroxide, bismuth oxide, bismuth hydroxide, bismuth nitrate, or a mixture thereof, (ii) a method of coating with a mixture of an inorganic compound such as magnesium hydroxide, aluminum hydroxide, zinc hydroxide, or titanium hydroxide, and a thermosetting resin such as a phenol resin or the like; and (iii) a method of double-coating with an inorganic compound such as magnesium hydroxide, aluminum hydroxide, zinc hydroxide, titanium hydroxide, or the like and further coating with a thermosetting resin such as a phenol resin or the like.

Examples of the organic phosphorus compound include general-purpose organic phosphorus-based compounds such as phosphoric acid ester compounds, phosphonic acid compounds, phosphinic acid compounds, phosphine oxide compounds, phosphorane compounds, organic nitrogen-containing phosphorus compounds, and the like; cyclic organic phosphorus compounds such as 9,10-dihydro-9-oxa-10-phosphaphenanthrene-10-oxide, 10-(2,5-dihydroxyphenyl)-10H-9-oxa-10-phosphaphenanthrene-10-oxide, 10-(2,7-dihydroxynaphthyl)-10H-9-oxa-10-phosphaphenanthrene-10-oxide, and the like; and derivatives produced by reacting the cyclic organic phosphorus compounds with a compound such as an epoxy resin, a phenol resin, or the like.

The amount of the phosphorus-based flame retardant mixed is properly selected according to the type of the phosphorus-based flame retardant, the other components of the curable resin composition, and the degree of desired flame retardance. For example, when red phosphorus is used as the non-halogen flame retardant, it is preferably mixed within a range of 0.1 to 2.0 parts by mass in 100 parts by mass of the curable resin composition containing all of the non-halogen flame retardant, the filler, and other additives, and when the organic phosphorus compound is used, it is preferably mixed within a range of 0.1 to 10.0 parts by mass and more preferably within a range of 0.5 to 6.0 parts by mass, in 100 parts by mass of the curable resin composition.

When the phosphorus-based flame retardant is used, the phosphorus-based flame retardant may be combined with hydrotalcite, magnesium hydroxide, a boron compound, zirconium oxide, a black dye, calcium carbonate, zeolite, zinc molybdate, activated carbon, or the like.

Examples of the nitrogen-based flame retardant include a triazine compound, a cyanuric acid compound, an isocyanuric acid compound, phenothiazine, and the like, and a triazine compound, a cyanuric acid compound, and an isocyanuric acid compound are preferred.

Examples of the triazine compound include melamine, acetoguanamine, benzoquanamine, melon, melam, succinoguanamine, ethylenedimelamine, polymelamine phosphate, triguanamine, and the like. Other examples include (1) aminotriazine sulfate compounds such as guanylmelamine sulfate, melem sulfate, melam sulfate and the like; (2) co-condensates of phenols, such as phenol, cresol, xylenol, butylphenol, nonylphenol, or the like, melamines such as melamine, benzoquanamine, acetoguanamine, formguanamine, or the like, and formaldehyde; (3) mixtures of the co-condensates (2) and a phenol resin such as phenol-formaldehyde condensate or the like, and (4) compounds prepared by further modifying the compound (2) or (3) with tung oil, isomerized linseed oil, or the like.

Examples of the cyanuric acid compound include cyanuric acid, melamine cyanurate, and the like.

The amount of the nitrogen-based flame retardant mixed is properly selected according to the type of the nitrogen-based flame retardant, the other components of the curable resin composition, and the degree of desired flame retardance. For example, the nitrogen-based flame retardant is preferably mixed within a range of 0.05 to 10 parts by mass and particularly preferably within a range of 0.1 to 5 parts by mass in 100 parts by mass of the curable resin composition containing all of the non-halogen flame retardant, the filler, and other additives.

Also, when the nitrogen-based flame retardant is used, it may be combined with a metal hydroxide, a molybdenum compound, or the like.

The silicone-based flame retardant is not particularly limited as long as it is an organic compound containing a silicon atom, and examples thereof include silicone oil, silicone rubber, silicone resin, and the like. The amount of the silicone-based flame retardant mixed is properly selected according to the type of the silicone-based flame retardant, the other components of the curable resin composition, and the degree of desired flame retardance. For example, the silicone-based flame retardant is preferably mixed within a range of 0.05 to 20 parts by mass in 100 parts by mass of the curable resin composition containing all of the non-halogen flame retardant, the filler, and other additive. Also, when the silicone-based flame retardant is used, it may be combined with a molybdenum compound, alumina, or the like.

Examples of the inorganic flame retardant include metal hydroxides, metal oxides, metal carbonate compounds, metal powders, boron compounds, low-melting-point glass, and the like.

Specific examples of the metal hydroxides include aluminum hydroxide, magnesium hydroxide, dolomite, hydrotalcite, calcium hydroxide, barium hydroxide, zirconium hydroxide, and the like.

Specific examples of the metal oxides include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, tungsten oxide, and the like.

Specific examples of the metal carbonate compounds include zinc carbonate, magnesium carbonate, calcium carbonate, barium carbonate, basic magnesium carbonate, aluminum carbonate, iron carbonate, cobalt carbonate, titanium carbonate, and the like.

Specific examples of the metal powders include powders of aluminum, iron, titanium, manganese, zinc, molybdenum, cobalt, bismuth, chromium, nickel, copper, tungsten, tin, and the like.

Specific examples of the boron compounds include zinc borate, zinc metaborate, barium metaborate, boric acid, borax, and the like.

Specific examples of the low-melting-point glass include glassy compounds such as CEEPREE (Bokusui Brown Co., Ltd.), hydrated glass $SiO_2$—$MgO$—$H_2O$, $PbO$—$B_2O_3$—, $ZnO$—$P_2O_5$—$MgO$—, $P_2O_5$—$B_2O_3$—$PbO$—$MgO$—, $P$—$Sn$—$O$—$F$—, $PbO$—$V_2O_5$—$TeO_2$—, and $Al_2O_3$—$H_2O$-based and lead borosilicate-based glass.

The amount of the inorganic flame retardant mixed is properly selected according to the type of the inorganic flame retardant, the other components of the curable resin composition, and the degree of desired flame retardance. For example, the inorganic flame retardant is preferably mixed within a range of 0.05 to 20 parts by mass and more preferably within a range of 0.5 to 15 parts by mass in 100 parts by mass of the curable resin composition containing all of the non-halogen flame retardant, the filler, and other additives.

Examples of the organic metal salt-based flame retardant include ferrocene, acetylacetonate metal complexes, organic metal carbonyl compounds, organic cobalt salt compounds, organic sulfonic acid metal salts, compounds each having ionic bond or coordinate bond between a metal atom and an aromatic compound or a heterocyclic compound, and the like.

The amount of the organic metal salt-based flame retardant mixed is properly selected according to the type of the organic metal salt-based flame retardant, the other components of the curable resin composition, and the degree of desired flame retardance. For example, the organic metal salt-based flame retardant is preferably mixed within a range of 0.005 to 10 parts by mass in 100 parts by mass of the curable resin composition containing all of the non-halogen flame retardant, the filler, and other additives.

If required, the curable resin composition of the present invention can be mixed with an inorganic filler (D). Examples of the inorganic filler (D) include fused silica, crystalline silica, alumina, silicon nitride, aluminum hydroxide, and the like. When the amount of the inorganic filler mixed is particularly increased, fused silica is preferably used. The fused silica can be used in either a crushed shape or a spherical shape, but the spherical shape is mainly preferably used for increasing the amount of the fused silica mixed and suppressing an increase in melt viscosity of a molding material. Further, in order to increase the amount of spherical silica mixed, the grain size distribution of the spherical silica is preferably properly adjusted. The filling rate is preferably as high as possible in view of flame retardance, and is particularly preferably 20% by mass or more relative to the total amount of the curable resin composition. Also, in the use for application to a conductive paste, a conductive filler such as a silver powder, a copper powder, or the like can be used.

If required, various compounding agents such as a silane coupling agent, a mold release agent, a pigment, an emulsifier, and the like can be added to the curable resin composition of the present invention.

<Application of Curable Resin Composition>

The curable resin composition of the present invention provides a cured product having excellent physical properties such as heat resistance, moisture resistance/solder resistance, flame retardance, and dielectric characteristics, and applications thereof include a semiconductor encapsulating material, a semiconductor device, a prepreg, a printed circuit board, a build-up substrate, a build-up film, a fiber-reinforced composite material, a fiber-reinforced resin molded product, a conductive paste, and the like.

1. Semiconductor Encapsulating Material

A method for producing the semiconductor encapsulating material from the curable resin composition of the present invention is, for example, a method of sufficiently melt-mixing the curable resin composition and compounding agents such as a curing accelerator, an inorganic filler, etc., if required, using an extruder, a kneader, a roll, or the like until the resultant mixture becomes uniform. In this case, fused silica is generally used as the inorganic filler, but in the case of use as a highly thermal conductive semiconductor encapsulating material for a power transistor and power IC, the material may be highly filled with crystalline silica, alumina, or silicon nitride, which has higher thermal conductivity than fused silica, or fused silica, crystalline silica, alumina, or silicon nitride may be used. The inorganic filler is preferably used at a filling rate within a range of 30 to 95% by mass per 100 parts by mass of the curable resin composition. In particular, the filling rate is more preferably 70 parts by mass or more and still more preferably 80 parts by mass or more for improving the flame retardance, moisture resistance, and solder crack resistance and for achieving a decrease in a linear expansion coefficient.

2. Semiconductor Device

A semiconductor package molding method for producing a semiconductor device from the curable resin composition of the present invention includes molding the semiconductor encapsulating material using cast molding, a transfer molding machine, or an injection molding machine, and further heating at 50° C. to 200° C. for 2 to 10 hours.

3. Prepreg

A method for producing a prepreg from the curable resin composition of the present invention is, for example, a method including impregnating a reinforcement substrate (paper, a glass cloth, a glass nonwoven fabric, aramid paper, aramid cloth, a glass mat, a glass roving cloth, or the like) with a varnish prepared by mixing the curable resin composition with an organic solvent described below, and then heating the substrate at a heating temperature, preferably 50° C. to 170° C., according to the type of the solvent used. The mass ratio between the resin composition and the reinforcement substrate is not particularly limited but is generally preferably adjusted so that the resin content in the prepreg is 20% to 60% by mass.

Examples of the organic solvent used include methyl ethyl ketone, acetone, dimethylformamide, methyl isobutyl ketone, methoxypropanol, cyclohexanone, methyl cellosolve, ethyl diglycol acetate, propylene glycol monomethyl ether acetate, and the like. The organic solvent used and appropriate amount thereof can be properly selected according to application. For example, when a printed circuit board is further produced from the prepreg as described below, a polar solvent having a boiling point of 160° C. or less, such as methyl ethyl ketone, acetone, dimethylformamide, or the like is preferred, and the solvent is preferably used at such a ratio that the nonvolatile content is 40% to 80% by mass.

4. Printed Circuit Board

A method for producing a printed circuit board from the curable resin composition of the present invention is, for example, a method of stacking the prepregs by a usual method, properly laminating a copper foil, and pressure-heat bonding them under a pressure of 1 to 10 MPa at 170° C. to 300° C. for 10 minutes to 3 hours.

5. Build-Up Substrate

A method for producing a build-up substrate by using the curable resin composition of the present invention includes the following steps. First, the curable resin composition properly containing rubber, a filler, or the like is applied to a circuit board, on which a circuit has been formed, by a spray coating method, a curtain coating method, or the like, and then the resin composition is cured (step 1). Then, if required, holes such as predetermined through holes are formed, and then the surface is treated with a roughening agent and washed with hot water to form irregularities, followed by plating with a metal such as copper or the like (step 2). This operation is successively repeated according to demand to alternately build-up a resin insulating layer and a conductor layer having a predetermined circuit (step 3). However, the through holes are formed after the outermost resin insulating layer is formed. Also, a build-up substrate of the present invention can be produced, without the step of forming a roughened surface and plating, by heat-pressure-bonding at 170° C. to 300° C. a copper foil with a resin, which is formed by semi-curing the resin composition on the copper foil, to a circuit substrate having a circuit formed thereon.

6. Build-Up Film

An example of a method for producing a build-up film by using the curable resin composition of the present invention is a method in which the curable resin composition of the present invention is applied to a support film and is then dried to form a resin composition layer on the support film. When the curable resin composition of the present invention is used for the build-up film, it is necessary for the film to soften under a lamination temperature condition (generally 70° C. to 140° C.) in a vacuum lamination method and exhibit fluidity (resin flow) enabling resin filling in via holes or through holes present in a circuit board at the same time as lamination on the circuit board. The components described above are preferably mixed so as to exhibit these characteristics.

The through holes of the circuit board generally have a diameter of 0.1 to 0.5 mm and a depth of 0.1 to 1.2 mm, and in general, filling of the resin can be preferably performed within this range. When both sides of the circuit board are laminated, the through holes are preferably about ½ filled.

Specifically, the build-up film can be produced by a method including preparing a varnish of the curable resin composition of the present invention by mixing with an organic solvent described below, applying the composition on a surface of a support film (Y), and further drying the organic solvent by heating or hot air spraying to form a layer (X) of the curable resin composition.

Examples of the organic solvent used include ketones such as acetone, methyl ethyl ketone, cyclohexanone, and the like; acetates such as ethyl acetate, butyl acetate, cellosolve acetate, propylene glycol monomethyl ether acetate, carbitol acetate, and like; carbitols such as cellosolve, butyl carbitol, and the like; aromatic hydrocarbons such as toluene, xylene, and the like; dimethylformamide; dimethylacetamide, N-methylpyrrolidone, and the like, and the solvent is preferably used at such a ratio that the nonvolatile content is 30% to 60% by mass.

The thickness of the formed layer (X) is generally equal to or larger than the thickness of a conductor layer. Since the thickness of the conductor layer possessed by the circuit board is generally within a range of 5 to 70 m, the thickness of the resin composition layer is preferably 10 to 100 µm. In addition, the resin composition layer (X) according to the present invention may be protected by a protective film described below. By protecting by the protective film, dust adhesion and flaws on the surface of the resin composition layer can be prevented.

Examples of the support film and the protective film include films of polyolefins such as polyethylene, polypropylene, polyvinyl chloride, and the like, polyesters such as polyethylene terephthalate (may be abbreviated as "PET" hereinafter), polyethylene naphthalate, and the like, polycarbonate; polyimide; release paper; metal foils such as a copper foil, an aluminum foil, and the like. The support film and the protective film may be subjected to treatment such as MAD treatment, corona treatment, or mold release treatment. The thickness of the support film is not particularly limited but is generally within a range of 10 to 150 μm and preferably 25 to 50 μm. The thickness of the protective film is preferably 1 to 40 μm.

The support film (Y) is separated after being laminated on the circuit board or after an insulating layer is formed by heat curing. When the support film (Y) is separated after the curable resin composition layer constituting the build-up film is heat-cured, adhesion of dust or the like can be prevented in the curing step. When separated after curing, the support film is generally previously subjected to mold release treatment.

By using the build-up film formed as described above, a multilayered printed circuit board can be produced. For example, when the layer (X) is protected by the protective film, the protective film is separated, and then the layer (X) is laminated on one or both of the sides of the circuit board by, for example, a vacuum lamination method so that the layer (X) is in direct contact with the circuit board. The lamination method may be either a batch method or a continuous method using a roll. In addition, if required, the build-up film and the circuit board may be heated (preheated) before lamination. The lamination conditions preferably include a pressure-bonding temperature (lamination temperature) of 70° C. to 140° C. and a pressure-bonding pressure of 1 to 11 kgf/cm$^2$ ($9.8 \times 10^4$ to $107.9 \times 10^4$ N/m$^2$), and lamination is preferably performed under reduced pressure at an air pressure of 20 mmHg (26.7 hPa) or less.

7. Fiber Reinforced Composite Material

A fiber-reinforced composite material can be produced from the curable resin composition of the present invention by a method of uniformly mixing the components constituting the curable resin composition to prepare a varnish, impregnating a reinforcement substrate composed of reinforcement fibers with the varnish, and then performing polymerization reaction.

Specifically, the curing temperature for polymerization reaction is preferably within a temperature range of 50° C. to 250° C., and particularly preferably, a tack-free cured product is produced by curing at 50° C. to 100° C. and then further treated under a temperature condition of 120° C. to 200° C.

A twisted yarn, untwisted yarn, or non-twisted yarn may be used for the reinforcement fibers, but the untwisted yarn or non-twisted yarn is preferred because both the moldability and mechanical strength of a fiber-reinforced plastic member are satisfied. Further, the reinforcement fibers having a form in which the fibers are paralleled in one direction, or a woven fabric can also be used. The woven fabric can be freely selected from a plain-woven fabric, a satin-woven fabric, and the like according to use place and application. Specifically, carbon fibers, glass fibers, aramid fibers, boron fibers, alumina fibers, silicon carbide fibers, or the like can be used because of excellent mechanical strength and durability. These can be used in combination of two or more types. Among these, the carbon fibers are particularly preferred in view of good strength of a molded product, and various types such as polyacrylonitrile-based, pitch-based, and rayon-based fibers, and the like can be used as the carbon fibers. In particular, the polyacrylonitrile-based carbon fibers are preferred because the carbon fibers having high strength can be easily produced. When the fiber-reinforced composite material is produced by impregnating the reinforcement substrate composed the reinforcement fibers with the varnish, the amount of the reinforcement fibers used is preferably such an amount that the volume content of the reinforcement fibers in the fiber-reinforced composite material is within a range of 40% to 85%.

8. Fiber-Reinforced Resin Molded Product

A fiber-reinforced resin molded product can be produced from the curable resin composition of the present invention by a hand lay-up method or spray-up method in which a fiber aggregate is placed in a mold and the varnish is laminated in multiple layers; a vacuum bag method in which a substrate composed of reinforcement fibers is stacked and molded while being impregnated with the varnish by using a male mold or a female mold, and a flexible mold capable of applying pressure to the molded product is put on the molded product, followed by airtight sealing and vacuum (reduced pressure) molding; a SMC press method in which the varnish containing reinforcement fibers is formed into a sheet which is then compression-molded by using a mold; a method in which reinforcement fibers are impregnated with the varnish to produce a prepreg by a RTM method of injecting the varnish into a matched mold in which the fibers are spread all over, and the prepreg is baked in a large-size autoclave; or the like. The fiber-reinforced resin molded product produced as descried above is a molded product containing the reinforcement fibers and a cured product of the curable resin composition, and specifically the amount of the reinforcement fibers in the fiber-reinforced molded product is preferably within a range of 40% to 70% by mass and particularly preferably within a range of 50% to 70% by mass in view of strength.

9. Conductive Paste

A method for producing a conductive paste from the curable resin composition of the present invention is, for example, a method of dispersing fine conductive particles in the curable resin composition. The conductive paste can be used for a paste resin composition for circuit connection and an anisotropic conductive adhesive according to the type of the fine conductive particles used.

<Method for Producing Curable Resin Composition>

The curable resin composition of the present invention which can be used for the applications described above can be produced by mixing the resin (A) having a benzoxazine structure and the epoxy resin (B). A method for producing the resin (A) having a benzoxazine structure constituting the curable resin composition of the present invention is described below.

Method for Producing the Resin Having a Benzoxazine Structure

The resin (A) having a benzoxazine structure of the present invention is produced by reacting a diamine compound (P), an aromatic dihydroxy compound (Q), an aromatic monohydroxy compound (R), and formaldehyde (S).

An example of the diamine compound (P) used is one represented by structural formula (P1) below.

[Chem. 10]

$$H_2N-L-NH_2 \qquad (P1)$$

In addition, L represents a divalent aliphatic hydrocarbon group, a divalent aromatic hydrocarbon group, a divalent group having an aliphatic hydrocarbon group and an aromatic hydrocarbon group, or a linking group in which one or a plurality of hydrogen atoms possessed by the hydrocarbon group are substituted by hydroxyl groups, alkoxy groups, or halogen atoms.

Specific examples of the linking group L include an alkylene group, an alkenylene group, an alkynylene group, a cycloalkylene group, an arylene group, an aralkylene group, a hydroxyl group-containing alkylene group, an alkoxy group-containing alkylene group, a halogenated alkylene group, a hydroxyl group-containing alkenylene group, an alkoxy group-containing alkenylene group, a halogenated alkenylene group, a hydroxyl group-containing alkynylene group, an alkoxy group-containing alkynylene group, a halogenated alkynylene group, a hydroxyl group-containing cycloalkylene group, an alkoxy group-containing cycloalkylene group, a halogenated cycloalkylene group, a hydroxyl group-containing arylene group, an alkoxy group-containing arylene group, a halogenated arylene group, a hydroxyl group-containing aralkylene group, an alkoxy group-containing aralkylene group, a halogenated aralkylene group, and the like. Specific groups of the alkylene group and the alkenylene group are as described above.

Also, the linking group L may be a linking group represented by structure formula (P1-1) or (P1-2) below.

[Chem. 11]

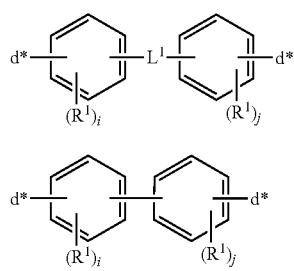

In the formulae (P1-1) and (P1-2), $L^1$ represents a divalent linking group. $R^1$ each independently represent a hydrogen atom, a hydrocarbon group, an alkoxy group, a hydroxyl group, a halogen atom, or a substituent in which one or more hydrogen atoms contained in a hydrocarbon group or an alkoxy group are substituted by any of hydroxyl groups and halogen atoms. Also, i represents an integer of 1 to 4, and j represents an integer of 1 to 4. d* represents a bonding point to an N atom in the structural formula (P1).

Specific linking groups represented by $L^1$ and specific substituents represented by $R^1$ are as described above.

Next, the aromatic dihydroxy compound (Q) used in the reaction is described. Examples of the aromatic dihydroxy compound (Q) used in the reaction include dihydroxybenzene such as 1,2-benzenediol, 1,3-benzenediol, 1,4-benzenediol, and the like; dihydroxynaphthalene such as 1,2-dihydroxynaphthalene, 1,4-dihydroxynaphthalene, 1,5-dihydroxynaphthalene, 1,6-dihydroxynaphthalene, 1,7-dihydroxynaphthalene, 2,3-dihydroxynaphthalene, 2,6-dihydroxynaphthalene, 2,7-dihydroxynaphthalene, and the like. These may be used alone or in combination of two or more.

Next, the aromatic monohydroxy compound (R) used in the reaction is described. Examples of the aromatic dihydroxy compound (R) used in the reaction include those represented by structural formulae (R1) and (R2) below.

[Chem. 12]

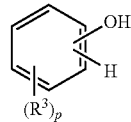

(R1)

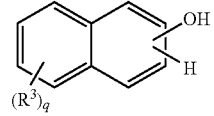

(R2)

In the formulae (R1) and (R2), $R^3$ each independently represent a hydrogen atom, a hydrocarbon group, an alkoxy group, a hydroxyl group, a halogen atom, or a substituent in which one or more hydrogen atoms contained in a hydrocarbon group or an alkoxy group are substituted by any of hydroxyl groups and halogen atoms. Also, p represents an integer of 1 to 4, and q represents an integer of 1 to 6. The bonding positions of an OH group and H atom are not particularly limited, but they are respectively bonded to adjacent carbon atoms of an aromatic ring.

Specific substituents represented by $R^3$ are as described above.

Examples of the aromatic monohydroxy compound include phenol, naphthol, and the like. These may be used alone or in combination of two or more. Among these, naphthol is preferred because of the excellent flame retardance and dielectric characteristics of a cure product.

Next, the formaldehyde (S) used in the reaction is described. The formaldehyde (S) may be used in the form of either formalin in a liquid state or paraformaldehyde in a solid state.

The reaction ratio between the diamine compound (P), the aromatic dihydroxy compound (Q), the aromatic monohydroxy compound (R), and the formaldehyde (S) is preferably such that the ratio of the aromatic dihydroxy compound (Q) is within a range of 0.25 to 0.90 moles, the ratio of the aromatic monohydroxy compound (R) is within a range of 0.10 to 0.75 moles, and the ratio of the formaldehyde is within a range of 1.5 to 2.5 moles per mole of amino group of the diamine compound (P) because the intended resin having a benzoxazine structure is more efficiently produced.

If required, the reaction between the diamine compound (P), the aromatic dihydroxy compound (Q), the aromatic monohydroxy compound (R), and the formaldehyde (S) may be performed in the presence of a catalyst. Various catalysts generally used for producing dihydrooxazine compounds can be used as the catalyst. Specific examples thereof include amide compounds such as N,N-dimethylformamide and the like; pyridine compounds such as pyridine, N,N-dimethyl-4-aminopyridine, and the like; amine compounds such as triethylamine, tetramethylethylenediamine, and the like; quaternary ammonium salts such as tetrabutylammonium bromide and the like; organic acid compounds such as acetic acid, trifluoroacetic acid, paratoluenesulfonic acid, trifluoromethanesulfonic acid, and the like; alkali metal hydroxides or carbonates such as potassium hydroxide, potassium carbonate, sodium carbonate, and the like; phenolic compounds such as dibutylhydroxytoluene and the like; metal catalysts such as palladium, tetrakis(triphenylphosphine)palladium, copper iodide, tin tetrachloride, nickel, platinum, and the like. These may be used alone or in combination of two or more.

If required, the reaction between the diamine compound (P), the aromatic dihydroxy compound (Q), the aromatic monohydroxy compound (R), and the formaldehyde (S) may be performed in an organic solvent. Examples of the organic solvent used include alcohol compounds such as water, methanol, ethanol, isopropanol, and the like; ether compounds such as dioxane, tetrahydrofuran, diethyl ether, and the like; acetic acid compounds such as acetic acid, trifluoroacetic acid, and the like; ketone compounds such as acetone, methyl ethyl ketone, methyl isobutyl ketone, cyclohexanone, and the like; acetic acid ester compounds such as ethyl acetate, butyl acetate, cellosolve acetate, propylene glycol monomethyl ether acetate, carbitol acetate, and the like; carbitol compounds such as cellosolve, butyl carbitol, and the like; chlorinated hydrocarbon compounds such as dichloromethane, chloroform, carbon tetrachloride, dichloroethane, chlorobenzene, and the like; hydrocarbon compounds such as cyclohexane, benzene, toluene, xylene, and the like; amide compounds such as dimethylformamide, dimethylacetamide, N-methylpyrrolidone, and the like; amine compounds such as aniline and the like; dimethyl sulfoxide; acetonitrile; and the like. These may be used alone or as a mixed solvent of two or more.

The reaction between the diamine compound (P), the aromatic dihydroxy compound (Q), the aromatic monohydroxy compound (R), and the formaldehyde (S) can be performed, for example, under a temperature condition of 50° C. to 100° C. After the completion of reaction, the intended resin having a benzoxazine structure can be produced by separating between an aqueous layer and an organic layer and then drying the organic solvent from the organic layer under reduced pressure.

EXAMPLES

Next, the present invention is specifically described below with reference to examples and comparative examples, and "parts" and "%" below are on a mass basis unless otherwise particularly specified. In addition, a softening point, a melting point, GPC, $^{13}$C-NMR, an MS spectrum, and IR were measured under the following conditions.

GPC: measured under the following conditions.
Measuring apparatus: "HLC-8220 GPC" manufactured by Tosoh Corporation
Column: guard column "HXL-L" manufactured by Tosoh Corporation
+"TSK-GEL G2000HXL" manufactured by Tosoh Corporation
+"TSK-GEL G2000HXL" manufactured by Tosoh Corporation
+"TSK-GEL G3000HXL" manufactured by Tosoh Corporation
+"TSK-GEL G4000HXL" manufactured by Tosoh Corporation
Detector: RI (differential refractometer)
Data processing: "GPC-8020 model II version 4.10" manufactured by Tosoh Corporation
Measurement condition:
Column temperature: 40° C.
Developing solvent: tetrahydrofuran
Flow rate: 1.0 ml/min
Standard: using monodisperse polystyrene below having a known molecular weight according to a measurement manual of "GPC-8020 model II version 4.10".
(Polystyrene Used)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation Sample: prepared by filtering, with a microfilter, a 1.0 mass % tetrahydrofuran solution in terms of resin solid content (50 μl).

$^{13}$C-NMR: measured by using "JNM-ECA500" manufactured by JEOL Ltd.
Magnetic field strength: 500 MHz
Pulse width: 3.25 μsec
Number of acquisitions: 8000
Solvent: DMSO-d6
Sample concentration: 30% by mass FD-MS: measured by using "JMS-T100GC AccuTOF" manufactured by JEOL Ltd.
Measurement range: m/z=4.00 to 2000.00
Rate of change: 51.2 mA/min
Final current value: 45 mA
Cathode voltage: −10 kV
Recording interval: 0.07 sec IR: measured by a KBr method using "Nicolet iS10" manufactured by Thermo Fisher Scientific Inc.

[Example 1] Synthesis of Resin (A-1) Having Benzoxazine Structure

Figure 2:
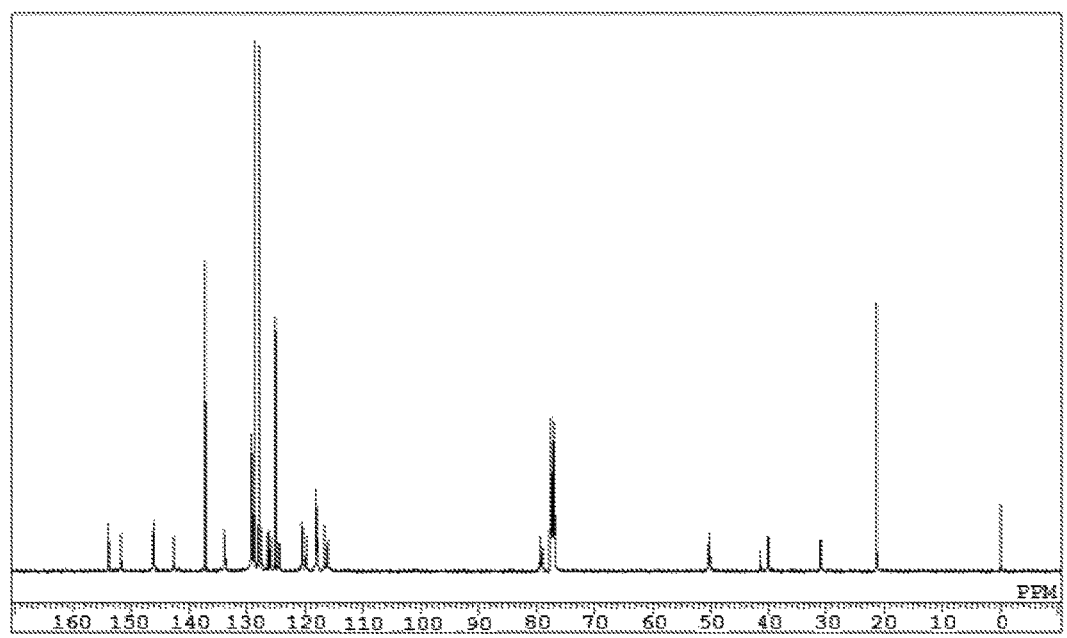
FIG. 2 is a $^{13}$C-NMR chart of a resin (A-1) having a benzoxazine structure produced in Example 1.
Figure 3:
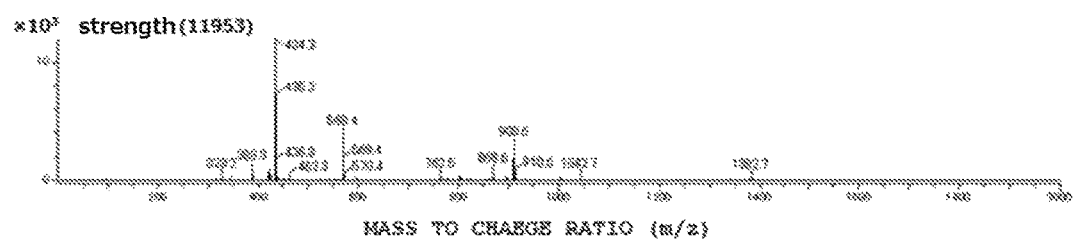
FIG. 3 is a FD-MS spectrum of a resin (A-1) having a benzoxazine structure produced in Example 1.

While flowing nitrogen gas, in a four-neck flask provided with a dropping funnel, a thermometer, a stirrer, a heating device, and a reflux condenser, 396.5 g (2.0 moles) of 4,4'-diaminodiphenylmethane, 188.2 g (2.0 moles) of phenol, and 228.3 g (1.0 mole) of bisphenol A were placed and dissolved in 910 g of toluene. Then, 572.0 g (8.0 moles) of a 42% aqueous formaldehyde solution was added to the resultant solution, and the resultant mixture was heated to 80° C. under stirring and reacted at 80° C. for 5 hours. After the reaction, the reaction solution was placed in a separating funnel, and an aqueous layer was removed. Then, the organic solvent was removed from an organic layer by heating under reduced pressure to produce 884 g of resin (A-1) having a benzoxazine structure. Next, GPC measurement, $^{13}$C-NMR measurement, FD-MS measurement, and IR measurement were performed for the resultant resin (A-1) having a benzoxazine structure. FIG. 1 shows a GPC chart of the resin (A-1) having a benzoxazine structure, FIG. 2 shows $^{13}$C-NMR, and FIG. 3 shows a FD-MS spectrum. The number-average molecule weight of the resin (A-1) having a benzoxazine structure is 1070, FIG. 3 shows that peaks at M$^+$=909, 1383, 1857, etc. are observed in the FD-MS spectrum and, although shown in the figure, an absorption of 950 cm$^{-1}$ is observed in an IR spectrum. Therefore, it was confirmed that the intended resin (A-1) having a benzoxazine structure is produced.

[Example 2] Synthesis of Resin (A-2) Having Benzoxazine Structure

While flowing nitrogen gas, in a four-neck flask provided with a dropping funnel, a thermometer, a stirrer, a heating device, and a reflux condenser, 396.5 g (2.0 moles) of 4,4'-diaminodiphenylmethane, 188.2 g (2.0 moles) of phenol, and 202.2 g (1.0 mole) of 4,4'-dihydroxydiphenyl ether were placed and dissolved in 883 g of toluene. Then, 572.0 g (8.0 moles) of a 42% aqueous formaldehyde solution was added to the resultant solution, and the resultant mixture was heated to 80° C. under stirring and reacted at 80° C. for 5 hours. After the reaction, the reaction solution was placed in a separating funnel, and an aqueous layer was removed. Then, the organic solvent was removed from an organic layer by heating under reduced pressure to produce 848 g of resin (A-2) having a benzoxazine structure.

[Example 3] Synthesis of Resin (A-3) Having Benzoxazine Structure

While flowing nitrogen gas, in a four-neck flask provided with a dropping funnel, a thermometer, a stirrer, a heating device, and a reflux condenser, 400.5 g (2.0 moles) of 4,4'-diaminodiphenyl ether, 188.2 g (2.0 moles) of phenol, and 228.3 g (1.0 mole) of bisphenol A were placed and dissolved in 913 g of toluene. Then, 572.0 g (8.0 moles) of a 42% aqueous formaldehyde solution was added to the resultant solution, and the resultant mixture was heated to 80° C. under stirring and reacted at 80° C. for 5 hours. After the reaction, the reaction solution was placed in a separating funnel, and an aqueous layer was removed. Then, the organic solvent was removed from an organic layer by heating under reduced pressure to produce 892 g of resin (A-3) having a benzoxazine structure.

[Comparative Example 1] Synthesis of Resin (A'-1) Having Benzoxazine Structure

While flowing nitrogen gas, in a four-neck flask provided with a dropping funnel, a thermometer, a stirrer, a heating device, and a reflux condenser, 456.0 g (2.3 moles) of 4,4'-diaminodiphenylmethane and 525.1 g (2.3 moles) of bisphenol A were placed and dissolved in chloroform. Then, 308.5 g (9.8 moles) of para-formaldehyde was added to the resultant solution, and the resultant mixture was reacted under reflux for 6 hours while the produced water was removed. Then, 188.2 g (2.0 moles) of phenol dissolved in chloroform was added and further reacted under reflux for 2 hours. After the reaction, the solution was washed with a large amount of methanol, and the residue was dried at 40° C. under reduced pressure to produce 1143 g of resin (A'-1) having a benzoxazine structure. The number-average molecule weight of the resin (A'-1) having a benzoxazine structure was 4150.

[Example 4 to Comparative Example 8] Production of Composition and Cured Product Compounds described below were mixed as shown in Tables 1 and 2, and each of the resultant mixtures was molded by a press at a temperature of 200° C. for 10 minutes and then post-cured at a temperature of 200° C. for 5 hours to produce a cured product having a thickness of 0.8 mm. The results of physical property evaluation of each of the resultant cured products are shown in Table 1 and Table 2.

A-1: the resin having a benzoxazine structure produced in Example 1

A-2: the resin having a benzoxazine structure produced in Example 2

A-3: the resin having a benzoxazine structure produced in Example 3

A'-1: the resin having a benzoxazine structure produced in Comparative Example 1

B-1: bisphenol A-type epoxy resin/average number of functional groups of 2

"EPICLON 850S" manufactured by DIC Corporation

B-2: naphthalene-type epoxy resin/average number of functional groups of 2

"EPICLON HP-4032SS" manufactured by DIC Corporation

B-3: naphthalene-type epoxy resin/average number of functional groups of 4

"EPICLON HP-4700" manufactured by DIC Corporation

B-4: naphthylene ether-type epoxy resin/average number of functional groups of 3

"EPICLON HP-6000" manufactured by DIC Corporation

B-5: cresol novolac-type epoxy resin/average number of functional groups of 7

"EPICLON N-680" manufactured by DIC Corporation

C-1: phenol novolac resin

"PHENOLITE TD-2131" manufactured by DIC Corporation

D-1: fused silica

"FB3SDC" manufactured by Denka Co., Ltd.

<Glass Transition Temperature>

The cured product having a thickness of 0.8 mm was cut into a size with a width of 5 mm and a length of 54 mm to form a test piece 1. The test piece 1 was used and a temperature at which a change in elastic modulus was maximized (the highest rate of change in tan δ) was measured by using a viscoelasticity measuring apparatus (DMA: Rheometrics Inc., solid viscoelasticity measuring apparatus "RSA II", rectangular tension method: frequency 1 Hz, heating rate 3° C./min) was evaluated as a glass transition temperature.

<Measurement of Dielectric Constant and Tangent>

According to JIS-C-6481, the test piece 1 was absolutely dried and then stored in a room at 23° C. and humidity 50% for 24 hours, and then a dielectric constant and tangent were measured at 1 GHz by using impedance material analyzer "HP4291B" manufactured by Agilent Technologies, Inc.

<Moisture Absorption Resistance>

The cured product having a thickness of 0.8 mm was cut into a size with a width of 25 mm and a length of 75 mm to form a test piece 2. The test piece 2 was used and allowed to stand in an atmosphere of 85° C./85% RH for 168 hours, and a change in mass before and after treatment was measured.

<Solder Reflow Property>

Ten test pieces 2 were formed and allowed to stand in an atmosphere of 85° C./85% RH for 168 hours, followed by moisture absorption treatment. Then, the number of the test pieces cracked was counted when the test pieces 2 were immersed in a solder bath of 260° C. for 10 seconds.

<Flame Retardance>

The cured product having a thickness of 0.8 mm was cut into a size with a width of 12.7 mm and a length of 127 mm to form a test piece 3. The test piece 3 was used in a combustion test using five test pieces 3 according to the UL-94 test method.

*1: Total combustion time (second) of five test pieces

*2: Maximum combustion time (second) at each time of flame contact

TABLE 1

|  | Example 4 | Example 5 | Example 6 | Example 7 | Example 8 | Example 9 | Example 10 | Example 11 | Example 12 |
|---|---|---|---|---|---|---|---|---|---|
| Curable resin composition | | | | | | | | | |
| A-1 (g) | 80 | 84 | 93 | 64 | | | | | 78 |
| A-2 (g) | | | | | 70 | 84 | | | |
| A-3 (g) | | | | | | | 80 | 90 | |
| A'-1 (g) | | | | | | | | | |
| B-1 (g) | 20 | | | | 30 | | 20 | | |
| B-2 (g) | | 16 | | | | 16 | | | |
| B-3 (g) | | | 7 | | | | | | |
| B-4 (g) | | | | 36 | | | | 10 | |
| B-5 (g) | | | | | | | | | 22 |
| C-1 (g) | 1 | 1 | 1 | 1 | 1 | 1 | 1 | 1 | 1 |
| D-1 (g) | 20 | 20 | 20 | 20 | 20 | 20 | 20 | 20 | 20 |
| $\beta/\alpha^{(1)}$ | 0.3 | 0.3 | 0.1 | 0.5 | 0.5 | 0.3 | 0.3 | 0.1 | 0.3 |
| Evaluation of physical properties | | | | | | | | | |
| Glass transition temperature (Tg/° C.) | 253 | 258 | 255 | 267 | 248 | 259 | 252 | 263 | 233 |
| Dielectric constant (1 GHz) | 3.9 | 3.8 | 3.8 | 3.7 | 3.9 | 3.9 | 3.8 | 3.7 | 4 |
| Dielectric loss tangent (1 GHz) | 0.009 | 0.007 | 0.008 | 0.006 | 0.01 | 0.008 | 0.009 | 0.006 | 0.011 |
| Moisture absorption (%) | 0.28 | 0.21 | 0.24 | 0.19 | 0.25 | 0.21 | 0.3 | 0.22 | 0.32 |
| Solder reflow property (piece) | 0 | 0 | 0 | 0 | 0 | 0 | 0 | 0 | 1 |
| Flame retardance (UL-94) | V-0 | V-0 | V-0 | V-0 | V-0 | V-0 | V-0 | V-0 | V-0 |
| ΣF (second) | 23 | 20 | 22 | 18 | 33 | 20 | 27 | 17 | 88 |
| $F_{max}$ (second) | 4 | 3 | 4 | 2 | 5 | 3 | 6 | 3 | 9 |

$^{(1)}\beta/\alpha$ represents an equivalent ratio of epoxy groups per benzoxazine structure in a resin having a benzoxazine structure in a composition.

TABLE 2

|  | Comparative Example 2 | Comparative Example 3 | Comparative Example 4 | Comparative Example 5 | Comparative Example 6 | Comparative Example 7 | Comparative Example 8 |
|---|---|---|---|---|---|---|---|
| Curable resin composition | | | | | | | |
| A-1 (g) | 100 | 61 | 58 | | | | 52 |
| A-2 (g) | | | | 54 | | | |
| A-3 (g) | | | | | 48 | | |
| A'-1 (g) | | | | | | 81 | |
| B-1 (g) | | | | 46 | | 19 | |
| B-2 (g) | | 39 | | | | | |
| B-3 (g) | | | 42 | | | | |
| B-4 (g) | | | | | 52 | | |
| B-5 (g) | | | | | | | 48 |
| C-1 (g) | 1 | 1 | 1 | 1 | 1 | 1 | 1 |
| D-1 (g) | 20 | 20 | 20 | 20 | 20 | 20 | 20 |
| $\beta/\alpha^{(1)}$ | 0 | 1 | 1 | 1 | 1 | 0.3 | 1 |
| Evaluation of physical properties | | | | | | | |
| Glass transition temperature (Tg/° C.) | 220 | 225 | 215 | 203 | 225 | 218 | 220 |
| Dielectric constant (1 GHz) | 4.3 | 4.2 | 4.4 | 4.5 | 4.3 | 4.4 | 4.4 |

TABLE 2-continued

| | Comparative Example 2 | Comparative Example 3 | Comparative Example 4 | Comparative Example 5 | Comparative Example 6 | Comparative Example 7 | Comparative Example 8 |
|---|---|---|---|---|---|---|---|
| Dielectric loss tangent (1 GHz) | 0.018 | 0.014 | 0.021 | 0.023 | 0.019 | 0.02 | 0.019 |
| Moisture absorption (%) | 0.4 | 0.31 | 0.47 | 0.44 | 0.39 | 0.45 | 0.44 |
| Solder reflow property (piece) | 4 | 2 | 6 | 5 | 3 | 4 | 5 |
| Flame retardance (UL-94) | V-1 | V-1 | V-1 | V-1 | V-1 | V-1 | V-1 |
| ΣF (second) | 144 | 123 | 153 | 188 | 148 | 182 | 178 |
| $F_{max}$ (second) | 18 | 22 | 27 | 29 | 22 | 26 | 24 |

(1) β/α represents an equivalent ratio of epoxy groups per benzoxazine structure in a resin having a benzoxazine structure in a composition.

The invention claimed is:

1. A curable resin composition comprising a resin (A) which has a benzoxazine structure represented by structural formula (A1) below and an epoxy resin (B) as essential components, wherein when the total number of moles of the benzoxazine structure in the resin (A) is a, and the number of moles of epoxy groups in the epoxy resin (B) is β, a ratio [(β)/(α)] is 0.1 to 0.5,

[Chem. 1]

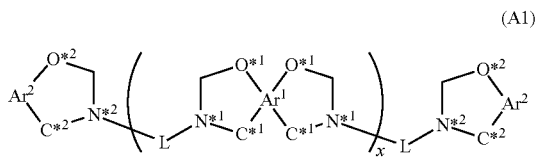

(A1)

[in the structural formula (A1), $Ar^1$ represents a tetravalent aromatic group, $Ar^2$ represents a divalent aromatic group, L represents a divalent linking group, x represents an average repeating number of 0.25 to less than 2.0, and $O^{*1}$ atom and $C^{*1}$ atom represent bonds to adjacent carbon atoms of an aromatic group represented by $Ar^1$, and $O^{*2}$ atom and $C^{*2}$ atom represent bonds to adjacent carbon atoms of an aromatic group represented by $Ar^2$].

2. The curable resin composition according to claim 1, wherein the linking group L is any divalent linking group selected from the group consisting of a structural formula (A2-1) below, a structural formula (A2-2) below, an alkylene group, an arylene group, and an aralkylene group,

[Chem. 2]

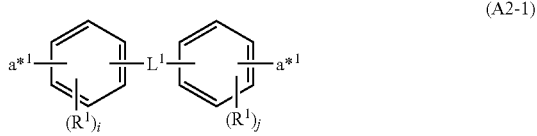

(A2-1)

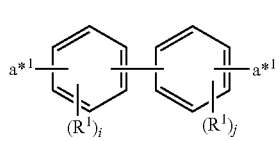

(A2-2)

[in the formulae (A2-1) and (A2-2), $L^1$ represents a divalent linking group, $R^1$ each independently represent a hydrogen atom, a hydrocarbon group, an alkoxy group, a hydroxyl group, a halogen atom, or a substituent in which one or more hydrogen atoms contained in a hydrocarbon group or an alkoxy group are substituted by any of hydroxyl groups and halogen atoms, i represents an integer of 1 to 4, j represents an integer of 1 to 4, and $a^{*1}$ represents a bonding point to an $N^{*1}$ atom or $N^{*2}$ in the structural formula (A1)].

3. A cured product of the curable resin composition according to claim 2.

4. A semiconductor device produced by using the curable resin composition according to claim 2, which contains further an inorganic filler in addition to the resin (A) having a benzoxazine structure and the epoxy resin (B).

5. A prepreg produced by using the curable resin composition according to claim 2.

6. A build-up film produced by using the curable resin composition according to claim 2.

7. A fiber-reinforced molded product produced by using the curable resin composition according to claim 2, which contains further reinforcement fibers in addition to the resin (A) having a benzoxazine structure and the epoxy resin (B).

8. The curable resin composition according to claim 2, wherein the linking group L is a divalent linking group selected from the group consisting of a structural formula (A2-1) below, a structural formula (A2-2) below, an arylene group, and an aralkylene group,

[Chem. 2]

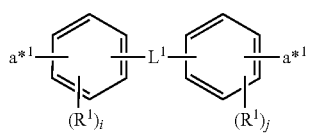

(A2-1)

-continued (A2-2)

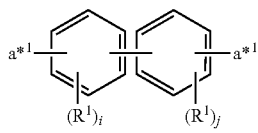

[in the formulae (A2-1) and (A2-2), $L^1$ represents a divalent linking group, $R^1$ each independently represent a hydrogen atom, a hydrocarbon group, an alkoxy group, a hydroxyl group, a halogen atom, or a substituent in which one or more hydrogen atoms contained in a hydrocarbon group or an alkoxy group are substituted by any of hydroxyl groups and halogen atoms, i represents an integer of 1 to 4, j represents an integer of 1 to 4, and $a^{*1}$ represents a bonding point to an $N^{*1}$ atom or $N^{*2}$ in the structural formula (A1)].

9. The curable resin composition according to claim 8, wherein the linking group L is a divalent linking group selected from the group consisting of a structural formula (A2-1) below and a structural formula (A2-2) below,

[Chem. 2]

(A2-1)

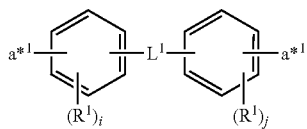

(A2-2)

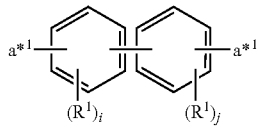

[in the formulae (A2-1) and (A2-2), $L^1$ represents a divalent linking group, $R^1$ each independently represent a hydrogen atom, a hydrocarbon group, an alkoxy group, a hydroxyl group, a halogen atom, or a substituent in which one or more hydrogen atoms contained in a hydrocarbon group or an alkoxy group are substituted by any of hydroxyl groups and halogen atoms, i represents an integer of 1 to 4, j represents an integer of 1 to 4, and $a^{*1}$ represents a bonding point to an $N^{*1}$ atom or $N^{*2}$ in the structural formula (A1)].

10. The curable resin composition according to claim 1, wherein $Ar^1$ is any tetravalent aromatic group selected from the group of structural formulae (A3-1) to (A3-4) below,

[Chem. 3]

(A3-1)

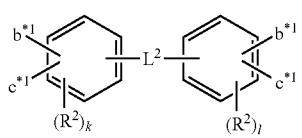

(A3-2)

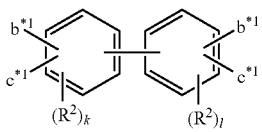

(A3-3)

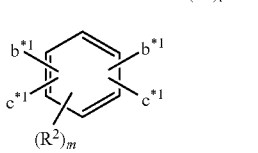

(A3-4)

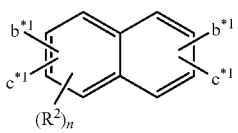

[in the formulae (A3-1) to (A3-4), $L^2$ represents a divalent linking group, $R^2$ each independently represent a hydrogen atom, a hydrocarbon group, an alkoxy group, a hydroxyl group, a halogen atom, or a substituent in which one or more hydrogen atoms contained in a hydrocarbon group or an alkoxy group are substituted by any of hydroxyl groups and halogen atoms, k represents an integer of 1 to 3, l represents an integer of 1 to 3, m represents an integer of 1 to 2, and n represents an integer of 1 to 4, and $b^{*1}$ and $c^{*1}$ represent bonding points to an $O^{*1}$ atom and $C^{*1}$ atom, respectively, shown in the structural formula (A1) and represent bonds to adjacent carbon atoms of an aromatic group shown in each of the structural formulae (A3-1) to (A3-4)].

11. A cured product of the curable resin composition according to claim 10.

12. A semiconductor device produced by using the curable resin composition according to claim 10, which contains further an inorganic filler in addition to the resin (A) having a benzoxazine structure and the epoxy resin (B).

13. A prepreg produced by using the curable resin composition according to claim 10.

14. A build-up film produced by using the curable resin composition according to claim 10.

15. A fiber-reinforced molded product produced by using the curable resin composition according to claim 10, which contains further reinforcement fibers in addition to the resin (A) having a benzoxazine structure and the epoxy resin (B).

16. The curable resin composition according to claim 1, wherein $Ar^2$ is any aromatic group selected from the group of structural formula (A4-1) below and structural formula (A4-2) below,

[Chem. 4]

(A4-1)

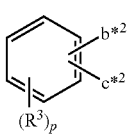

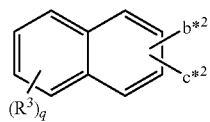

(A4-2)

[in the formulae (A4-1) and (A4-2),

R³ each independently represent a hydrogen atom, a hydrocarbon group, an alkoxy group, a hydroxyl group, a halogen atom substituent, or a substituent in which one or more hydrogen atoms contained in a hydrocarbon group or an alkoxy group are substituted by any of hydroxyl groups and halogen atoms, p represents an integer of 1 to 4 and q represents an integer of 1 to 6, and b*² and c*² represent bonding points to an O*² atom and C*² atom, respectively, shown in the structural formula (A1) and represent bonds to adjacent carbon atoms of an aromatic group shown in each of the structural formulae (A4-1) and (A4-2)].

17. A cured product of the curable resin composition according to claim 1.

18. A semiconductor device produced by using the curable resin composition according to claim 1, which contains further an inorganic filler in addition to the resin (A) having a benzoxazine structure and the epoxy resin (B).

19. A prepreg produced by using the curable resin composition according to claim 1.

20. A build-up film produced by using the curable resin composition according to claim 1.

21. A fiber-reinforced molded product produced by using the curable resin composition according to claim 1, which contains further reinforcement fibers in addition to the resin (A) having a benzoxazine structure and the epoxy resin (B).

* * * * *